United States Patent [19]

Van De Grift et al.

[11] Patent Number: 5,008,731
[45] Date of Patent: Apr. 16, 1991

[54] INTEGRATED SEMICONDUCTOR CIRCUIT WITH DECOUPLED D.C. WIRING

[75] Inventors: Robert E. J. Van De Grift; Martien Van Der Veen; André J. Linssen, all of Eindhoven, Netherlands

[73] Assignee: U.S. Philip Corp., New York, N.Y.

[21] Appl. No.: 483,290

[22] Filed: Feb. 16, 1990

Related U.S. Application Data

[63] Continuation of Ser. No. 235,250, Aug. 22, 1988, abandoned.

[30] Foreign Application Priority Data

Aug. 26, 1987 [NL] Netherlands ............... 8701997

[51] Int. Cl.⁵ ............................................. H01L 29/44
[52] U.S. Cl. ........................................ 357/71; 357/51; 357/65; 357/45; 357/68; 357/23.6
[58] Field of Search ................. 357/51, 65, 45, 71, 357/68, 23.6

[56] References Cited

U.S. PATENT DOCUMENTS

| 4,613,883 | 9/1986 | Tihanyi ............... | 357/23.6 |
| 4,646,126 | 2/1987 | Iizuka ................. | 357/71 |
| 4,654,689 | 3/1987 | Fujii .................. | 357/51 |
| 4,656,058 | 4/1987 | Dwyer ................ | 357/71 |
| 4,737,830 | 4/1988 | Patel et al. ........... | 357/68 |
| 4,785,202 | 11/1988 | Toyoda ............... | 357/51 |
| 4,796,084 | 1/1989 | Kamasaki et al. ..... | 357/68 |

Primary Examiner—Jerome Jackson, Jr.
Attorney, Agent, or Firm—Steven R. Biren

[57] ABSTRACT

An integrated semiconductor circuit, in which the D.C. part of the wiring containing only D.C. information lies on a part of the insulating layer located on the surface which is considerably thinner than the parts of the insulating layer under wiring parts not forming part of the D.C. wiring. Preferably, for this purpose a substrate contact diffusion connected to a reference potential is provided under the D.C. wiring parts. As a result, H.F. interference signals on the D.C. wiring are reduced so that noise and distortion are considerably reduced.

7 Claims, 2 Drawing Sheets

INTEGRATED SEMICONDUCTOR CIRCUIT WITH DECOUPLED D.C. WIRING

This is a continuation of application Ser. No. 235,250, filed Aug. 22, 1988, now abandoned.

BACKGROUND OF THE INVENTION

The invention relates to an integrated semiconductor circuit having a semiconductor region which adjoins a surface of a semiconductor body and is covered with an electrically insulating layer, the semiconductor region including a plurality of semiconductor circuit elements which are interconnected by conductor tracks disposed on the insulating layer and constituting the wiring of the circuit, a part of the wiring being intended only to contain D.C. information and constituting the D.C. wiring.

When designing integrated semiconductor circuits, nearly always the problem of high-frequency interference arises. The high-frequency electric fields caused thereby may originate from high-frequency interference signals at the supply lines, but also from transient phenomena occurring in the semiconductor circuit elements forming part of the circuit. The high-frequency interference signals thus produced in the various wiring parts give rise to noise and distortion.

In order to counteract these phenomena, decoupling capacitances can be provided. These capacitances can be provided entirely or in part in the semiconductor body of the integrated circuit, but they then generally occupy additional surface area.

SUMMARY OF THE INVENTION

The present invention has inter alia for its object to reduce said high-frequency interference without additional semiconductor surface area being required.

According to the invention, an integrated semiconductor circuit of the general kind described above is characterized in that the insulating layer under at least a substantial part of the D.C. wiring is considerably thinner than under the wiring parts not forming part of the D.C. wiring, this thinner part being located on a part of the semiconductor surface which is connected to a connection conductor.

Due to the fact that the D.C. wiring according to the invention forms via the thin parts of the insulating layer a large capacitance to the adjacent semiconductor surface, a satisfactory relative decoupling of the D.C. wiring with respect to the high-frequency parts of the circuit can be attained when this semiconductor surface is applied to a reference potential.

In general, when designing integrated circuits and more particularly high-frequency circuits, it is considered disadvantageous to provide the wiring over comparatively thin parts of the insulating layer because a large capacitance between the wiring and the adjacent semiconductor region is thus obtained.

However, the invention is based on the recognition of the fact that this is not disadvantageous for wiring parts carrying only D.C. information and that the more satisfactory relative decoupling between H.F. and D.C. wiring parts thus obtained considerably reduces the aforementioned noise and distortion.

The said thinner part of the insulating layer located below the D.C. wiring can advantageously be obtained without additional processing steps by utilizing the fact that generally only a thin oxide layer is disposed above diffused or implanted surfaces already present in the circuit. According to a preferred embodiment, the thinner part of the insulating layer is therefore located above a highly doped surface zone, which is provided in the semiconductor region and is connected through at least one opening in the insulating layer to said connection conductor. Preferably, this highly doped surface zone is of the same conductivity type as the subjacent semiconductor region. Such a surface zone is in fact present in most integrated semiconductor circuits in the form of a substrate contact zone, on which at different areas substrate contacts are realized through windows in the insulating layer.

The thinner part of the insulating layer can extend practically only below the D.C. wiring. More particularly if the D.C. wiring is provided above a highly doped surface zone, it is to be preferred that a substantial part of the thinner part of the insulating layer (with associated doped surface zone) is also provided outside the D.C. wiring. The resistance to the subjacent semiconductor region is thus considerably reduced.

In order to obtain a reasonable relative decoupling of the high-frequency wiring extending over the thicker part of the insulating layer, the thickness of the thinner part of the insulating layer will preferably be less than one third of that of the remaining part of the insulating layer.

The thickness of the thinner part of the insulating layer will preferably be at least 10 nm in order to guarantee a satisfactory insulation between the D.C. wiring and the semiconductor surface, while this thickness will be at most 500 nm in order to obtain a sufficiently large decoupling capacitance.

BRIEF DESCRIPTION OF THE DRAWING

The invention will now be described more fully with reference to an embodiment and the drawing, in which.

Figure 1:
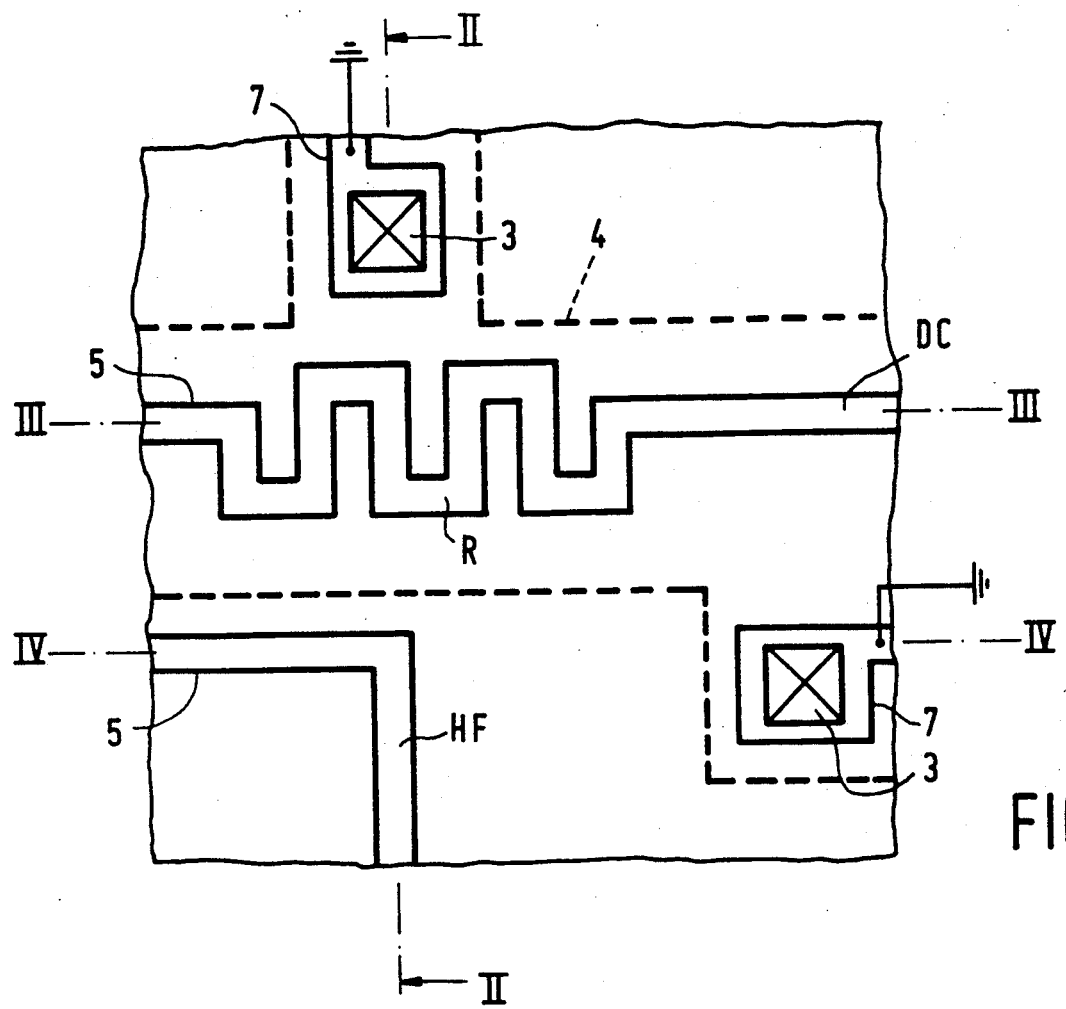
FIG. 1 shows diagrammatically in plan view a part of an integrated semiconductor circuit according to the invention.

The Figures are purely schematic and not drawn to scale, while for the sake of clarity in particular dimensions in the direction of thickness are greatly exaggerated.

Corresponding parts are designated in the Figures by the same reference numerals. In the cross-sections, semiconductor regions of the same conductivity are crosshatched in the same direction.

DESCRIPTION OF THE PREFERRED EMBODIMENTS

Figure 2:
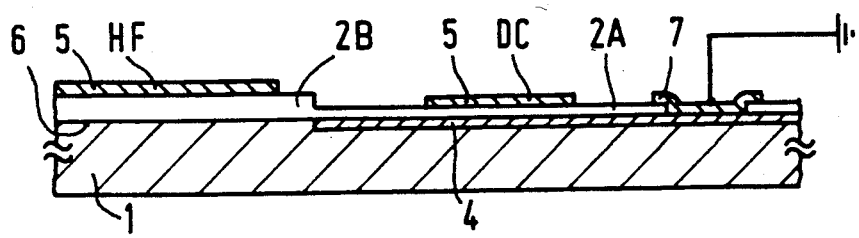
FIGS. 2, 3 and 4 show diagrammatically cross-sections of the integrated circuit shown in FIG. 1 taken on the lines II—II, III—III and IV—IV, respectively.

FIG. 1 shows diagrammatically in plan view a part of an integrated semiconductor circuit according to the invention. The circuit comprises a semiconductor body having a semiconductor region 1 adjoining a surface 6 (cf. FIG. 2) and covered with an electrically insulating layer 2. In the semiconductor region 1 are provided a plurality of semiconductor circuit elements, at least part of which operate at high frequency. These circuit elements, which as such are not essential to the invention and are therefore not indicated further in the drawing, are interconnected by conductor tracks 5, mostly metal tracks, which are disposed in the insulating layer 2 and constitute the wiring of the circuit. Part of the wiring indicated in the Figures by DC is intended only to contain D.C. information; this part is designated in this application as the D.C. wiring. Due to high-frequency signals at the supply line and/or to high-frequency signals originating from other parts of the circuit, high-frequency interference can be induced, which may give rise to noise and/or distortion.

According to the invention, this high-frequency interference at the D.C. parts of the circuit is suppressed in that the insulating layer 2 is considerably thinner under at least a substantial part of the D.C. wiring (DC) than under the wiring parts (HF) not forming part of the D.C. wiring, this thinner part (2A) of the insulating layer being located on a part of the semiconductor surface connected to a connection conductor 7.

Due to the small thickness of the insulating layer parts 2A and due to the fact that the D.C. wiring extends for a considerable part over these thin parts 2A, a large capacitance between the D.C. wiring and the semiconductor surface is obtained without additional semiconductor surface area being required. When the connection conductor 7 is applied to a reference potential (in this embodiment to ground), a substantially complete decoupling between the H.F. and D.C. parts of the wiring is attained.

In this embodiment, the thinner part 2A of the insulating layer is located above a highly doped surface zone 4, which is provided in the semiconductor region 1 and is connected through the openings 3 (cf. FIG. 1) in the insulating layer 2 to the connection conductor 7. The zone 4 is in this case of the same conductivity type as the semiconductor region 1. In this embodiment, the semiconductor region 1 is a p-type silicon substrate and the zone 4 is consequently strongly p-type conducting, while the substrate 1 is contacted via the connection conductor(s) 7. In all integrated semiconductor circuits, in which the substrate is contacted on the upper side, such substrate contact zones 4 are present so that the use of the invention does not require additional processing steps. The highly doped zone 4 extends everywhere under the thin part 2A of the layer 2, so in this embodiment also outside the D.C. wiring, and thus ensures a low resistance to the region 1.

In this embodiment, the insulating layer 2 consists of silicon oxide, while the thin parts 2A have a thickness of about 0.08 μm and the thicker parts 2B have a thickness of about 1.5 m. The thinner parts 2A consequently have a thickness of less than ⅕, in this embodiment of about 1/20, of the thickness of the thicker parts 2B.

The D.C. wiring (DC) may consist solely of connection conductors, but may also comprise passive circuit elements, such as, for example, an ohmic resistor R (cf. FIG. 1).

By the use of the present invention, it is possible to limit the number of external decoupling capacitances. Moreover, in certain circuits, such as, for example, A/D converters, the linearity at high frequencies can be improved due to the reduction of distortion by interference signals.

Figure 5:
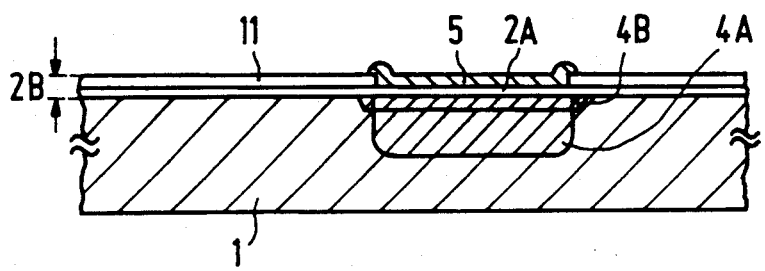
FIGS. 5, 6 and 7 show details of other embodiments of the invention.

It will be appreciated that the invention is not limited to the example described here, but that many variations are possible within the scope of the invention for those skilled in the art. For example, the highly doped surface zone 4 need not be a single zone. See FIG. 5, in which a substrate contact zone 4 composed of a deep more weakly doped subzone 4A and a shallow more highly doped subzone 4B is shown diagrammatically in cross-section. The insulating layer 2, instead of consisting solely of silicon oxide, may also consist of a composite layer, of which, for example, the thin parts 2A are constituted by an oxide layer 10 and the thicker parts 2B are constituted by this oxide layer 10 together with a silicon nitride layer 11 disposed thereon. (cf. FIG. 5).

Figure 6:
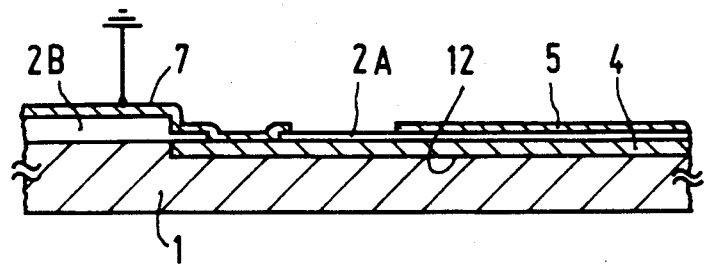

The highly doped surface zone 4 need not have the same conductivity type either as the semiconductor (substrate) region 1, in which the semiconductor circuit elements are provided. The zone 4 may also be (cf. FIG. 6) a zone of opposite conductivity type, which forms a pn junction 12 with the surrounding region 1 and is connected to a connection conductor 7, which is applied to a reference potential.

Figure 3:
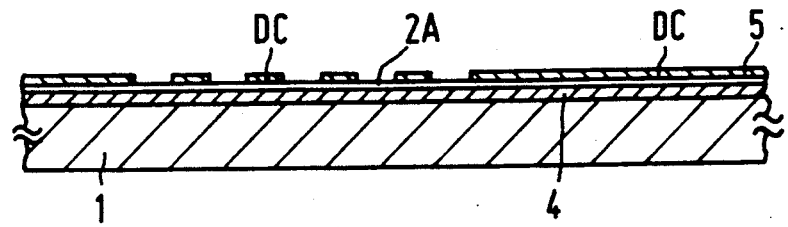
Figure 4:
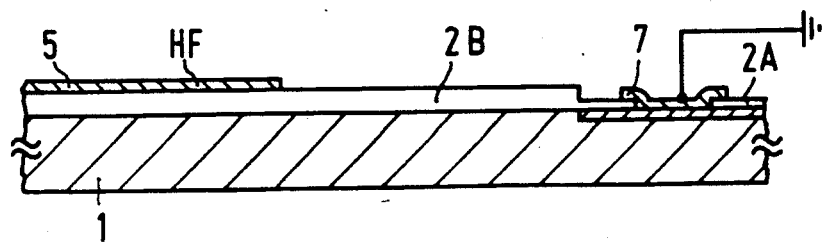
Figure 7:
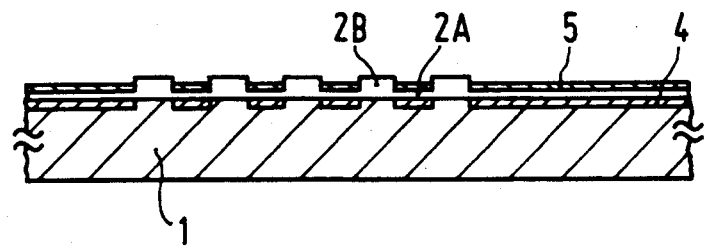

Further, the thin part 2A of the insulating layer 2 and the highly doped surface zone 4 may also be provided only under the D.C. wiring and not outside this wiring. See FIG. 7, in which the cross-section of FIG. 3 is shown for the case in which the zone 4 and the thin oxide layer part 2A are located only under the D.C. wiring.

Finally, in given circumstances, the surface zone 4 may be omitted entirely or in part, in which case the D.C. wiring together with the thin layer part 2A and the subjacent region 1 forms the decoupling capacitance.

What is claimed is:

1. A monolithic integrated semiconductor circuit comprising a semiconductor body, a semiconductor region adjoining a surface of said semiconductor body and covered with an electrically insulating layer, the semiconductor region including a plurality of semiconductor circuit elements interconnected by conductor tracks disposed on the insulating layer and comprising the wiring of the circuit, said wiring including means for carrying only D.C. information and comprising at least one first conductor track, and said wiring including means for carrying A.C. information and comprising at least one second conductor track, said insulating layer having a first layer portion under only said second conductor track and a second, substantially thinner adjacent layer portion under only said first conductor track and located alongside said first layer portion, said first and second conductor tracks being substantially on different levels, and a connection conductor connected to a part of the semiconductor surface, said second layer portion being located on said part of the semiconductor surface which is connected to said connection conductor.

2. An integrated semiconductor circuit as claimed in claim 1, characterized in that the second layer portion is located above a highly doped surface zone, which is provided in said semiconductor region and is connected through at least one opening in the insulating layer to said connection conductor.

3. An integrated semiconductor circuit as claimed in claim 2, characterized in that said highly doped surface zone is of the same conductivity type as said semiconductor region.

4. An integrated semiconductor circuit as claimed in claim 1, 2 or 3, characterized in that a substantial part of the insulating layer extends outside the first conductor track.

5. An integrated semiconductor circuit as claimed in claim 1, 2 or 3, characterized in that the thickness of the second layer portion of the insulating layer is less than one third of the thickness of the first layer portion of the insulating layer.

6. An integrated semiconductor circuit as claimed in claim 1, 2 or 3, characterized in that the thickness of the second layer portion of the insulating layer is at least 10 nm and at most 500 nm.

7. An integrated semiconductor circuit as claimed in claim 1, 2 or 3, characterized in that said connection conductor is connected to a reference potential.

* * * * *